United States Patent
Bhandari et al.

(10) Patent No.: US 10,605,823 B2
(45) Date of Patent: Mar. 31, 2020

(54) MULTIPLE MEMS DEVICE AND METHODS

(71) Applicant: mCube, Inc., San Jose, CA (US)

(72) Inventors: Sanjay Bhandari, San Jose, CA (US); Ken Wang, San Jose, CA (US); Ben Lee, San Jose, CA (US)

(73) Assignee: m.Cube, Inc., San Jose, CA (US)

( * ) Notice: Subject to any disclaimer, the term of this patent is extended or adjusted under 35 U.S.C. 154(b) by 102 days.

(21) Appl. No.: 15/444,162

(22) Filed: Feb. 27, 2017

(65) Prior Publication Data

US 2017/0248628 A1 Aug. 31, 2017

Related U.S. Application Data

(60) Provisional application No. 62/300,001, filed on Feb. 25, 2016.

(51) Int. Cl.
*G01P 15/08* (2006.01)
*B81B 7/00* (2006.01)

(52) U.S. Cl.
CPC ............ *G01P 15/08* (2013.01); *B81B 7/0074* (2013.01); *B81B 7/0087* (2013.01); *G01P 15/0802* (2013.01); *B81B 2201/0235* (2013.01); *B81B 2201/0242* (2013.01); *B81B 2201/0257* (2013.01); *B81B 2201/0264* (2013.01);

(Continued)

(58) Field of Classification Search
CPC ............................ G01P 2015/0851; G01P 3/14
See application file for complete search history.

(56) References Cited

U.S. PATENT DOCUMENTS 8,823,007 B2  9/2014 Yang
2010/0192689 A1* 8/2010 Ulm ............... B81B 7/0012
                                                        73/430

(Continued)

FOREIGN PATENT DOCUMENTS

WO    WO 2012/125651 A2    9/2012

OTHER PUBLICATIONS

International Search Report and Written Opinoin for PCT/US2017/019766 dated Nov. 28, 2017.

*Primary Examiner* — Herbert K Roberts
(74) *Attorney, Agent, or Firm* — Richard T. Ogawa; Owaga P.C.

(57) ABSTRACT

A method for operating an electronic device comprising a first and second MEMS device and a semiconductor substrate disposed upon a mounting substrate includes subjecting the first MEMS device and the second MEMS device to physical perturbations, wherein the physical perturbations comprise first physical perturbations associated with the first MEMS device and second physical perturbations associated with the second MEMS device, wherein the first physical perturbations and the second physical perturbations are substantially contemporaneous, determining in a plurality of CMOS circuitry formed within the one or more semiconductor substrates, first physical perturbation data from the first MEMS device in response to the first physical perturbations and second physical perturbation data from the second MEMS device in response to the second physical perturbations, determining output data in response to the first physical perturbation data and to the second physical perturbation data, and outputting the output data.

21 Claims, 3 Drawing Sheets

(52) U.S. Cl.
CPC . *B81B 2201/0292* (2013.01); *B81B 2201/047* (2013.01); *B81B 2207/012* (2013.01); *H01L 2224/32145* (2013.01); *H01L 2224/48091* (2013.01); *H01L 2224/73265* (2013.01)

(56) References Cited

U.S. PATENT DOCUMENTS

| | | | |
|---|---|---|---|
| 2010/0273286 A1 | 10/2010 | Liang et al. | |
| 2012/0086446 A1* | 4/2012 | Shaeffer | G01R 33/0286 324/252 |
| 2013/0263660 A1* | 10/2013 | Shibata | G01C 19/56 73/504.02 |
| 2014/0102172 A1 | 4/2014 | Daamen et al. | |
| 2014/0260704 A1* | 9/2014 | Lloyd | B81C 1/0023 73/865.8 |
| 2015/0220109 A1* | 8/2015 | von Badinski | G01P 15/00 340/539.12 |
| 2015/0238813 A1* | 8/2015 | Saiki | G06K 9/00342 702/141 |
| 2016/0046483 A1 | 2/2016 | Cheng et al. | |

\* cited by examiner

MULTIPLE MEMS DEVICE AND METHODS

CROSS-REFERENCE TO RELATED APPLICATIONS

The present invention is a non-provisional of U.S. Provisional Patent Application No. 62/300,001 filed Feb. 25, 2016. That application is herein by incorporated by reference in its entirety, for all purposes.

BACKGROUND

The present invention is directed to MEMS (Micro-Electro-Mechanical-Systems). More specifically, embodiments of the invention provide methods and structures for a MEMS device having improved performance.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Pixel™ phone by Google of Mountain View, Calif., and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving IC devices and MEMS are highly desired.

BRIEF SUMMARY OF THE INVENTION

The present invention is directed to integrated MEMS (Micro-Electro-Mechanical-Systems) IC (Integrated Circuit) devices. More specifically, embodiments of the invention provide a method and structure of a MEMS device with improved performance.

Embodiments of the present invention incorporate two or more integrated MEMS modules disposed upon a land grid array (LGA) substrate. The integrated MEMS modules typically includes one or more MEMS devices such as a three-axis accelerometer, a three-axis gyroscope, a magnetometer, or the like, integrated with control logic, such as CMOS logic. In various embodiments, the two or more integrated MEMS modules are bonded (e.g. wire bonded) to the LGA substrate. In some examples, additional control logic such as a processor or controller may also be bonded onto the LGA substrate. An encapsulant such as an epoxy or metal lid may then be disposed above the bonded devices and a portion of the LGA substrate to protect the resultant device.

According to one aspect of the invention, an electronic device is described. One apparatus includes a mounting substrate selected from a group consisting of: a rigid printed circuit board, a flexible circuit board, a packaging substrate, and a wafer substrate, a first MEMS device configured to provide data in response to a physical perturbation of the electronic device, and a second MEMS device configured to provide data in response to the physical perturbation of the electronic device. A device may include one or more semiconductor substrates disposed on the mounting substrate and coupled to the first MEMS device and the second MEMS device, wherein the one or more semiconductor substrates comprise a plurality of CMOS circuitry, wherein a first portion of the plurality of CMOS circuitry is configured to sense the data from the first MEMS device and the second MEMS device, and wherein a second portion of the plurality of CMOS circuitry is configured to output data in response to the data that is sensed.

According to another aspect of the invention, a method for operating an electronic device comprising a first MEMS device, a second MEMS device, and one or more semiconductor substrates, disposed upon a mounting substrate is disclosed. A method may include subjecting the first MEMS device and the second MEMS device to physical perturbations, wherein the physical perturbations comprise first physical perturbations associated with the first MEMS device and second physical perturbations associated with the second MEMS device, wherein the first physical perturbations and the second physical perturbations are substantially contemporaneous. A technique may include determining in a plurality of CMOS circuitry formed within the one or more semiconductor substrates, first physical perturbation data from the first MEMS device in response to the first physical perturbations and second physical perturbation data from the second MEMS device in response to the second physical perturbations. A process may include determining output data in response to the first physical perturbation data and to the second physical perturbation data in a processor disposed upon the mounting substrate; and outputting with the processor, the output data.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention relates to MEMS devices. More specifically, the present invention relates to increasing durability of MEMS devices. Typical MEMS devices includes accelerometers, gyroscopes, pressure sensors, and the like.

Figure 1:
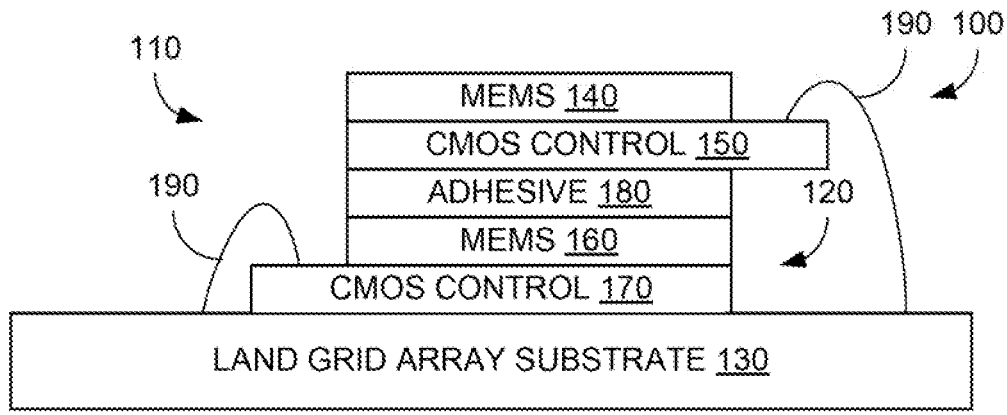
FIG. 1 illustrates an embodiment of the present invention.

FIG. 1 illustrates an embodiment of the present invention. More specifically, FIG. 1 illustrates a device 100 including a first MEMS device 110 and a second MEMS device 120 disposed upon a mounting substrate 130. As illustrated, first integrated MEMS device 110 and second integrated MEMS device 120 are vertically disposed above one another, and coupled via an adhesive 180. Additionally, as illustrated, first integrated MEMS device 110 and second integrated MEMS device 120 are coupled to mounting substrate 130 via bond wires 190.

In various embodiments, first integrated MEMS device 110 is a device that integrates and includes a MEMS portion 140 and a semiconductor substrate 150, and second integrated MEMS device 120 is a device that integrates and includes a MEMS portion 160 and a semiconductor substrate 170. MEMS portion 140 and MEMS portion 160 may include the same type of MEMS sensor, for example both accelerometers. In various embodiments, the type of MEMS sensors may be accelerometers, gyroscopes, pressure sensors, magnetic sensors, or the like.

In typical embodiments, a semiconductor substrate, e.g., 150 and 170, includes CMOS circuitry that provides controlling electrical signals to MEMS portion, e.g. respectively 140 and 160, and receives responsive electrical signals from the respective MEMS portion. Outputs from the CMOS circuitry, e.g. 150 and 170, typically indicates sensed data from the MEMS portion, e.g. respectively 140 and 160, in response to physical perturbations, e.g. bumps, changes in rotation, etc. experienced by the MEMS portion. Additionally, the sensed data may be associated with a quality factor, e.g. frequency, resolution, offset, and the like. In some embodiments, the outputs from CMOS circuitry may be an output signal or register value having a characteristic: frequency, voltage, current, phase, or the like. Further, the output signal or register value may be an analog value, a digital value, or the like.

In various embodiments, first integrated MEMS device 110 and second integrated MEMS device 120 are devices under development or available by the current assignee of the present invention, mCube, Inc. In such embodiments, first integrated MEMS device 110, for example, MEMS portion 140 and CMOS substrate 150 are integrated together in a single package.

Figure 2:
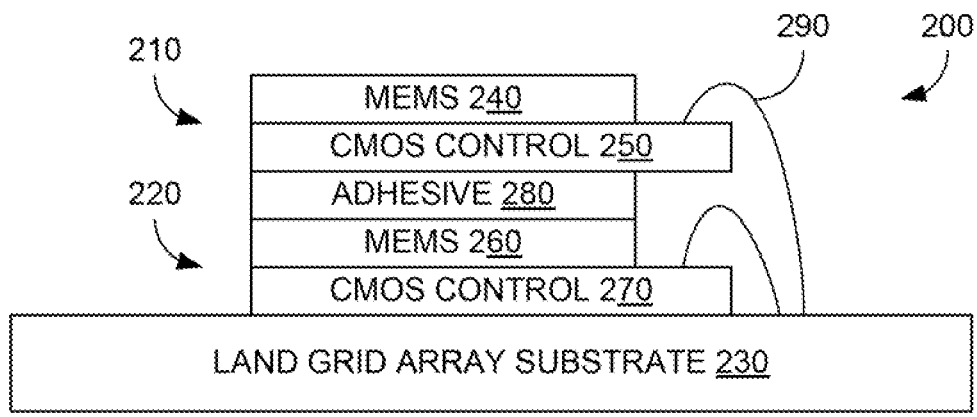
FIG. 2 illustrates an embodiment of the present invention.

FIG. 2 illustrates another embodiment of the present invention. FIG. 2 illustrates another device 200 including a first integrated MEMS device 210 and a second integrated MEMS device 220 disposed upon a mounting substrate 230. As illustrated, first MEMS device 210 and second MEMS device 220 are vertically disposed above one another, and coupled via an adhesive 280. Additionally, as illustrated, first MEMS device 210 and second MEMS device 220 are coupled to mounting substrate 230 via bond wires 290.

In various embodiments, first MEMS device 210 includes a MEMS portion 240 and a semiconductor substrate 250, and second MEMS device 220 includes a MEMS portion 260 and a semiconductor substrate 270. MEMS portion 240 and MEMS portion 260 may include the same type of MEMS sensor, for example both accelerometers. In various embodiments, the type of MEMS sensors may be accelerometers, gyroscopes, pressure sensors, magnetic sensors, or the like.

Similar to the embodiment in FIG. 1, in various embodiments, first integrated MEMS device 210 and second integrated MEMS device 220 are devices under development or available by the current assignee of the present invention, mCube, Inc.

Figure 3:
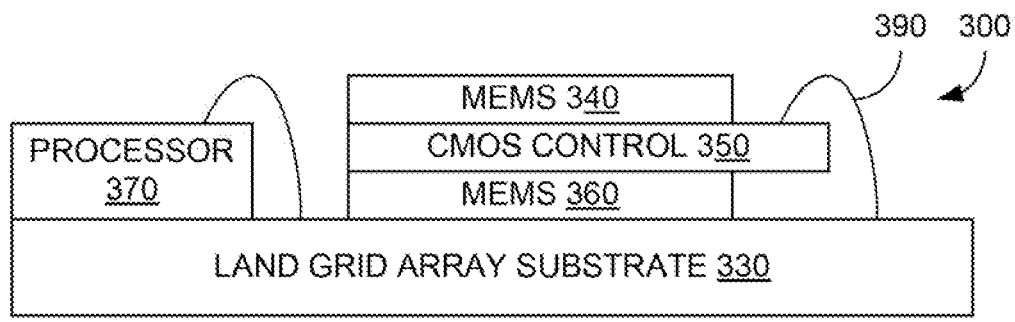
FIG. 3 illustrates an embodiment of the present invention.

FIG. 3 illustrates another embodiment of the present invention. FIG. 3 illustrates another device 300 having an integrated MEMS device 310 including a first MEMS portion 340 and a second MEMS portion 360 disposed upon a mounting substrate 330. As illustrated, first MEMS portion 340 and second MEMS portion 360 are vertically disposed above one another. Additionally, as illustrated, first MEMS portion 340 and second MEMS portion 360 are coupled to mounting substrate 330 via bond wires 390.

In various embodiments, first MEMS portion 340 and second MEMS portion 360 are both coupled to semiconductor substrate 350 including CMOS control circuits, as discussed above. MEMS portion 340 and MEMS portion 360 may include the same type of MEMS sensor, for example both accelerometers. In various embodiments, the type of MEMS sensors may be accelerometers, gyroscopes, pressure sensors, magnetic sensors, or the like. In various embodiments, first MEMS portion 340, second MEMS portion 360 are semiconductor substrate 350 are devices under development by the current assignee of the present invention, mCube, Inc.

In embodiments of the present invention, MEMS portion 340 and MEMS portion 360, for example, are in very close proximity, as with all the embodiments described herein. Accordingly, it is expected that MEMS portion 340 and MEMS portion 360 will often be subjected to substantially similar and contemporaneous physical perturbations, and will often return substantially contemporaneous MEMS data, e.g. x, y, z acceleration data; x, y, z rotational data, or the like). In various embodiments, the inventors of the present invention recognize that having two sets of input MEMS data to provide data can have substantial advantages in terms of data reliability, power savings, noise reduction, expanded data range and the like.

Figure 4:
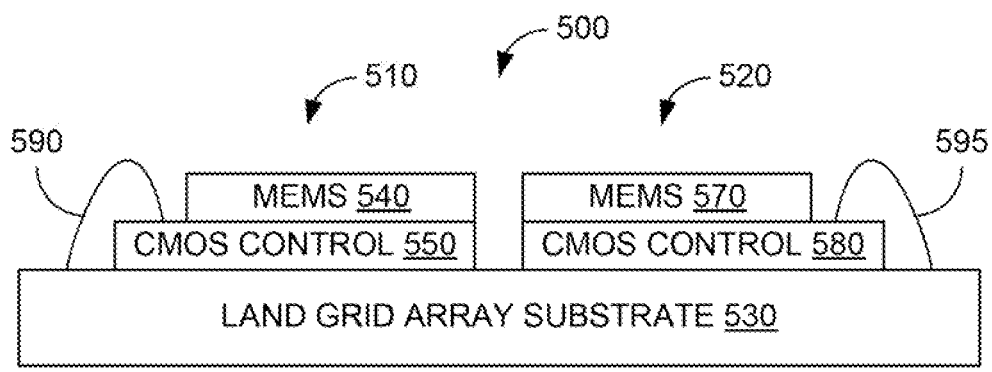
FIG. 4 illustrates an embodiment of the present invention.

FIG. 4 illustrates an embodiment of the present invention. More specifically, FIG. 4 illustrates a device 500 including a first integrated MEMS device 510 and a second integrated MEMS device 520 disposed upon a mounting substrate 530. As illustrated, first MEMS device 510 and second MEMS device 520 are horizontally disposed with respect to one another. Additionally, as illustrated, first MEMS device 510 and second MEMS device 520 are coupled to mounting substrate 530 via bond wires 590 and 595.

In various embodiments, first MEMS device 510 includes a MEMS portion 540 and a semiconductor substrate 550, and second MEMS device 520 includes a MEMS portion 570 and a semiconductor substrate 580. MEMS portion 540 and MEMS portion 570 may include the same type of MEMS sensor, for example both accelerometers. In various embodiments, the type of MEMS sensors may be accelerometers, gyroscopes, pressure sensors, magnetic sensors, or the like.

In various embodiments, first MEMS device 510 and second MEMS device 520 are devices under development or available by the current assignee of the present invention, mCube, Inc. In such embodiments, first MEMS device 510, for example, MEMS portion 540 and CMOS substrate 560 are integrated together in a single package.

In various embodiments, one or more processors or controllers are mounted and electrically coupled to the same substrate as the integrated MEMS devices (e.g. COB configuration). For example, a processor 370 is illustrated mounted upon substrate 330 in FIG. 3. A processor may also be mounted upon the substrate of any of the embodiments describe herein. In various embodiments, various processing functions described below may by performed by these co-mounted processors in full or in part. In other embodiments, accelerometer data from devices 100, 200, 300 and 500 are output to an external processor or controller. In these embodiments, various processing functions described below may be performed by such external processors, as well as other functions. Processors or controllers may be disposed upon substrate 130, 230, 330 or 530 and used to perform some or all of the functions described below, such as MIN or MAX, average, sum, dynamic range adjustment, and the like, as described herein.

Figure 5:
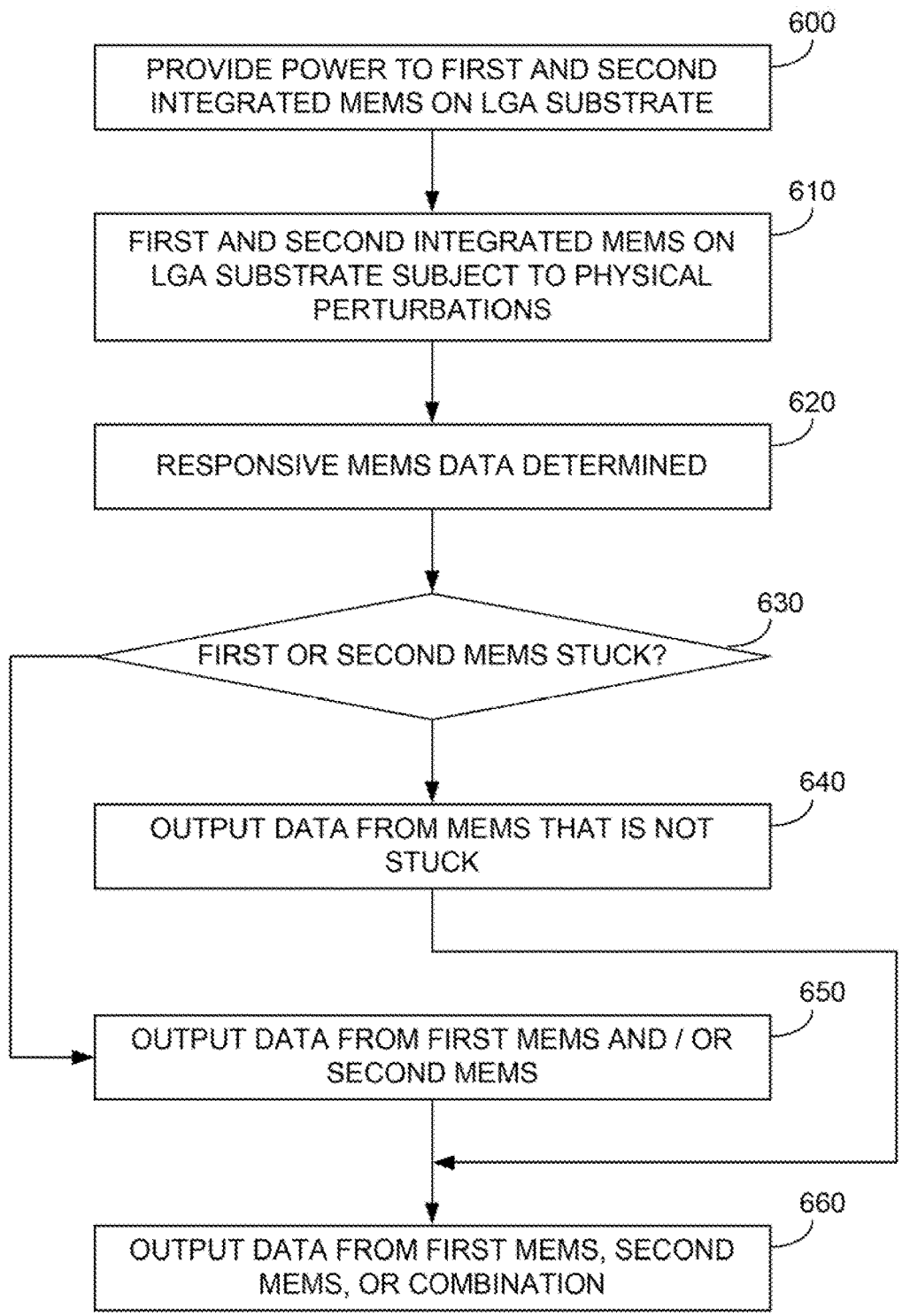
FIG. 5 illustrates a functional block diagram of various embodiments of the present invention.

FIG. 5 illustrates a block diagram of a method of operation for various embodiments of the present invention. More specifically, this example is directed to addressing MEMS stiction problems. The below is described with reference to FIG. 3, for sake of convenience:

1) providing power to MEMS portion 340 and MEMS portion 360, step 600. In various embodiments, power is provided to substrate, e.g. the land grid array (LGA) or other substrate. In various embodiments, MEMS portion 340 and MEMS portion 360 may be the same type of MEMS device, e.g. accelerometer, gyroscope, magnetometer, pressure sensor, or the like. MEMS portion 340 and MEMS portion 360 may be operated at the same or different operating conditions. For example, MEMS portion 340 may be driven at a lower sampling frequency compared to MEMS portion 360; MEMS portion 340 may have a lower offset value compared to MEMS portion 360 such that together these devices have a higher bit resolution, than each can separately support (e.g. 16-*bit* versus 8-*bit* a piece); MEMS portion 340 and MEMS portion 360 may be driven with the same driving parameters; or the like;
2) subjecting MEMS portion 340 and MEMS portion 360 to substantially similar physical perturbations, step 610. In various embodiments, because the MEMS devices are physically separate, they may be subject to slightly different physical perturbations, but still substantially similar;
3) determining data from both devices in CMOS 350. In various embodiments, based upon the driving parameters from CMOS control circuits 350, MEMS 240 and MEMS 260 provide responsive data, step 620. The data may be in the form of updated register values, a modulation of a signal, a phase change, or the like. Such data may be determined substantially at the same time, determined serially, or the like;
4) determining in processor 370 whether either MEMS portion 340 or MEMS portion 360 are subject to stiction forces (i.e. stuck), step 630. In various embodiments, if the responsive data from MEMS 240 or MEMS 260 does not change in response to the physical perturbations, it may be assumed that MEMS 240 or MEMS 260 is stuck, possible due to stiction problems within the MEMS device;
5) using acceleration data based upon data from MEMS portion 340 when MEMS portion 360 is stuck, or vice versa, step 640. In various embodiments, it is assumed that the MEMS device that is changes in response to the physical perturbations is operating properly, whereas the unchanging MEMS device is subject to stiction forces. Accordingly, data from the working MEMS device may be used the correct acceleration data, rotational data, pressure data, or the like;
6) using acceleration data based upon data from MEMS portion 340 or MEMS portion 360, if neither are stuck, step 650. In various embodiments, if the data from each MEMS portion is responsive to the same physical perturbation, either or both may provide valid output data; and
7) processing the acceleration data with the processor, step 660. In various embodiments, the data from either of the MEMS portions may be processed by the processor, or data from both of the MEMS portions may be processed, e.g. combined, averaged, subtracted, concatenated, or the like. The processed data may then be output.

Another method of operation for embodiments of the present invention to increase MEMS performance includes:
1) providing power to MEMS portion 340 and MEMS portion 360;
2) subjecting MEMS portion 340 and MEMS portion 360 to substantially similar physical perturbations over a time period;
3) determining data from MEMS portion 340 in CMOS 350 for a first portion of the time period;
4) determining data from MEMS portion 360 in CMOS 350 for a second portion of the time period;
5) determining in processor 370 acceleration data based upon data from CMOS 350 for the first portion and based upon data from CMOS 350 for the second portion;
6) outputting from device 300 based upon the acceleration data.

In additional embodiments, the above process may include:
3.5) determining that buffers in CMOS 350 are full, prior to step 4).

Such embodiments enable the MEMS device to buffer more data prior to waking a host coupled to the device and providing the MEMS data.

A method of operation for embodiments of the present invention to reduce MEMS noise includes:
1) providing power to MEMS portion 340 and MEMS portion 360;
2) subjecting MEMS portion 340 and MEMS portion 360 to substantially similar physical perturbations;
3) receiving data from both devices in CMOS 350;
4) combining (e.g. averaging) in processor 370, the data from CMOS 350; and
5) outputting acceleration data from device 300 to a host based upon the combined data.

These embodiments may reduce accelerometer noise and offsets by factor of square root of 2, or the like.

A method of operation for embodiments of the present invention to reduce MEMS power consumption includes:
1) providing power to MEMS portion 340 and MEMS portion 360;

2) subjecting MEMS portion 340 and MEMS portion 360 to substantially similar physical perturbations;
3) determining data from MEMS portion 340 at a first frequency rate within CMOS 350;
4) determining in processor 370 an occurrence of an event from data from CMOS 350;
5) determining data from MEMS portion 360 at a second frequency rate within CMOS 350; (first frequency rate<second frequency rate) before or after detecting the event data; and
6) outputting acceleration data from device 300 to a host based upon the data from MEMS portion 360.

Potential applications include sleep monitoring, or the like, where upon detection of a large physical perturbation acceleration based upon a low sampling frequency, output data is subsequently output based upon a higher sampling frequency. The high resolution data may be provided for motion after the event and may be provided for the event itself.

A method of operation for embodiments of the present invention to determine event data includes:
1) providing power to MEMS portion 340 and MEMS portion 360;
2) subjecting MEMS portion 340 and MEMS portion 360 to substantially similar physical perturbations;
3) determining in CMOS control 350, data from MEMS portion 340 at a first frequency rate;
5) determining in CMOS 350, data from MEMS portion 360 at a second frequency rate (first frequency rate<second frequency rate); and
6) determining in processor 370 acceleration data based upon the data from CMOS control 350.

Potential applications include false event detection (e.g. step counting, faking physical motions), fault tolerance, or the like.

As mentioned above, in various embodiments, a processor and the devices described above may be integrated on the same substrate (e.g. a COB configuration). In other embodiments, the devices described above may be coupled to an external processor (host) (e.g. a processor of a smart device). In various embodiments, one or more processors may implement software that utilizes MEMS data from two or more of the same MEMS devices (e.g. accelerometers) as data input.

In various embodiments, the one or more processors may perform mathematical operations such as adding, averaging of the data from two sensors of the same type to improve effective resolution, reduce noise and offsets; the one or more processors may observe data from both sensors and choose only one set of data or combination data to provide fault tolerance (e.g. if a sensor shows mechanical faults (e.g. stiction), then only data from second sensor that does not exhibit the issue is communicated or used by the processor (or application using data)); the one or more processors may receive data from a second MEMS device only after determining an event occurring with a first MEMS device (e.g. taking high resolution or high granularity data from a second MEMS device); the one or more processors may concatenate data from a first MEMS device and then a second MEMS device; and the like.

In various embodiments, the two or more MEMS devices may be the same (e.g. have substantially similar responses to physical perturbations), and in other embodiments, the two or more MEMS devices may be the same time of MEMS device, but may have different sensitivities or dynamic range, operating frequencies, or the like. For example, one MEMS accelerometer may have a maximum rating of 100 G and a second MEMS accelerometer may have a maximum rating of 200 G, yet both can be utilized at the same time. As two or more sensors of similar or different types stacked or placed in single MCM higher fault tolerance, higher resolution and improved noise, offset is achieved.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

We claim:

1. An electronic device comprising:
    a mounting substrate selected from a group consisting of: a rigid printed circuit board, a flexible circuit board, a packaging substrate, and a wafer substrate;
    a first MEMS device comprising a first accelerometer configured to provide first data in response to a first physical perturbation of the electronic device;
    a second MEMS device comprising a second accelerometer configured to provide second data in response to the first physical perturbation of the electronic device and configured to provide third data in response to a second physical perturbation subsequent to the first physical perturbation;
    a first semiconductor substrate disposed on the mounting substrate and coupled to the first MEMS device, wherein the first semiconductor substrate comprises a first plurality of CMOS circuitry configured to sense the first data from the first MEMS device and configured to output first sensed data in response to the first data;
    a second semiconductor substrate disposed above the first MEMS device and coupled to the second MEMS device, wherein the second semiconductor substrate comprises a second plurality of CMOS circuitry configured to sense the second data from the second MEMS device and configured to output second sensed data at a first data rate in response to the second data, and configured to sense the third data from the second MEMS device and configured to output third sensed data at a second data rate in response to the third data; and
    a processor disposed upon the mounting substrate and coupled to the first and second semiconductor substrates, wherein the processor is configured to receive the first sensed data, wherein the processor is configured to determine whether a magnitude of the first sensed data exceeds a predetermined magnitude, and wherein the processor is configured to change a driving rate associated with the second MEMS device from a first frequency to a second frequency in response to determining that the magnitude of the first sensed data exceeds the predetermined magnitude, wherein the second frequency exceeds the first frequency.

2. The electronic device of claim 1
    wherein the processor is configured increase a data rate associated with the second MEMS device from the first data rate to the second data rate in response to determining that the magnitude of the first accelerometer data exceeds the predetermined magnitude.

3. The electronic device of claim 1 further comprising an additional MEMS device disposed above the mounting substrate selected from a group consisting of: a gyroscope, a magnetometer, a pressure sensor, a sound sensor, a light sensor, and an image sensor.

4. The electronic device of claim 1 further comprising a potting material disposed upon the mounting substrate and covering the first MEMS device, the second MEMS device, and the first and second semiconductor substrates.

5. The electronic device of claim 1
wherein the first semiconductor substrate comprises a first driver configured to provide first drive signals to the first MEMS device;
wherein the second semiconductor substrate comprises a second driver, configured to provide second drive signals to the second MEMS device and third drive signals to the second MEMS device; and
wherein the first drive signals and the second drive signals include a parameter selected from a group consisting of: operation frequency, power consumption mode, and performance parameters.

6. The electronic device of claim 5 wherein an operation frequency associated with the second drive signals is lower than an operation frequency associated with the third drive signals.

7. The electronic device of claim 1 wherein the mounting substrate comprises a land grid array substrate.

8. The electronic device of claim 1
wherein the processor is configured to determine output data in response to the first sensed data, to the second sensed data, and to the third sensed data; and
wherein the processor is configured to provide the output data to a host processor.

9. The electronic device of claim 1
wherein the first accelerometer is configured to provide fourth data in response to the second physical perturbation of the electronic device; and
wherein the first plurality of CMOS circuitry is configured to sense the fourth data from the first MEMS device and configured to output fourth sensed data.

10. The electronic device of claim 9
wherein the processor is configured to determine output data in response to a mathematical function performed upon the third sensed data and to the fourth sensed data; and
wherein the mathematical function is selected from a group consisting of:
addition, averaging, selecting, and subtracting.

11. A method for operating an electronic device comprising a first MEMS device comprising a first accelerometer, a second MEMS device comprising a second accelerometer, and a first and a second semiconductor substrate, wherein the first semiconductor substrate is disposed upon a mounting substrate, and wherein the second semiconductor substrate is disposed upon the first MEMS device, wherein the method comprises:
subjecting the first MEMS device and the second MEMS device to physical perturbations, wherein the physical perturbations comprise first physical perturbations associated with the first MEMS device and second physical perturbations associated with the second MEMS device, wherein the first physical perturbations and the second physical perturbations are substantially contemporaneous;
determining in a first plurality of CMOS circuitry formed within the first semiconductor substrate first physical perturbation data from the first MEMS device in response to the first physical perturbations;
determining in a second plurality of CMOS circuitry formed with the second semiconductor substrate second physical perturbation data from the second MEMS device in response to the second physical perturbations, wherein the second MEMS device is driven with a first driving rate;
determining whether a magnitude of the first physical perturbation data exceeds a predetermined magnitude; thereafter
subjecting the second MEMS device to third physical perturbations;
in response to determining that the magnitude of the first physical perturbation data exceeds the predetermined magnitude, driving the second MEMS device with a second driving rate and determining in the second plurality of CMOS circuitry third physical perturbation data from the second MEMS device in response to the third physical perturbations, wherein the second driving rate exceeds the first driving rate;
determining output data in response to the first physical perturbation data, to the second physical perturbation data, and to the third physical perturbation data; and
outputting the output data.

12. The method of claim 11
wherein a processor is disposed upon the mounting substrate; and
wherein the determining whether the magnitude of the first physical perturbation data exceeds the predetermined magnitude comprises determining in the processor whether the magnitude of the first physical perturbation data exceeds the predetermined magnitude.

13. The method of claim 12
wherein the first physical perturbation data is associated with a first quality value; and
wherein the second physical perturbation data is associated with a second quality value;
wherein the third physical perturbation data is associated with a third quality value; and
wherein the third quality value and the second quality value are associated with a parameter selected from a group consisting of: noise, resolution, offset, and data rate.

14. The method of claim 13
wherein determining the output data comprises selecting the third physical perturbation data as the output data.

15. The method of claim 14 wherein the outputting the output data comprising outputting the output data to a host device.

16. The method of claim 11
wherein the second semiconductor substrate comprises a second driver; and
wherein the method comprises driving with the second driver, the second MEMS device at the first driving rate.

17. The method of claim 16 wherein second drive signals, associated with determining the third physical perturbation data, and first drive signals, associated with determining the second physical perturbation data, are different and are associated with parameters selected from a group consisting of: operation frequency, power consumption mode, resolution, offset, bit rate, and data rate.

18. The method of claim 16 further comprising:
driving with the second driver, the second MEMS device at the second driving rate in response to determining that the magnitude of the first physical perturbation data exceeds the predetermined magnitude.

19. The method of claim 11 further comprising:
subjecting the first MEMS device to the third physical perturbations substantially contemporaneous with the subjecting the second MEMS device to the third physical perturbations;
determining in the first plurality of CMOS circuitry fourth physical perturbation data from the first MEMS device in response to the third physical perturbations; and
wherein the determining the output data is in response to the third physical perturbation data and to the fourth physical perturbation data.

20. The method of claim 19 wherein the determining the output data comprises mathematically processing the third physical perturbation data and the fourth physical perturbation data with a mathematical function.

21. The method of claim 20 wherein the mathematical function is selected from a group consisting of: addition, averaging, selecting, and subtracting.

* * * * *